(12) United States Patent
Lai et al.

(10) Patent No.: US 8,384,454 B2
(45) Date of Patent: Feb. 26, 2013

(54) DLL CIRCUIT WITH DYNAMIC PHASE-CHASING FUNCTION AND METHOD THEREOF

(75) Inventors: Yu-Sheng Lai, Hsinchu (TW); Feng-Chia Chang, Taipei County (TW); Chun Shiah, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 191 days.

(21) Appl. No.: 13/024,287

(22) Filed: Feb. 9, 2011

(65) Prior Publication Data

US 2012/0056652 A1 Mar. 8, 2012

(30) Foreign Application Priority Data

Sep. 6, 2010 (TW) .............................. 99130082 A

(51) Int. Cl.
*H03L 7/06* (2006.01)

(52) U.S. Cl. ........ 327/157; 327/158; 375/374; 375/375; 375/376

(58) Field of Classification Search .................. 327/158, 327/157, 156
See application file for complete search history.

(56) References Cited

U.S. PATENT DOCUMENTS 6,828,835 B2 * 12/2004 Cho .............................. 327/158
7,298,189 B2 * 11/2007 Kang et al. .................... 327/158
7,893,738 B2 * 2/2011 Kang et al. .................... 327/158

* cited by examiner

*Primary Examiner* — Ryan Jager
(74) *Attorney, Agent, or Firm* — Winston Hsu; Scott Margo

(57) ABSTRACT

A method of dynamically adjusting phase-chasing speed for increasing efficiency of a DLL circuit includes detecting an overall loop delay for an input clock signal in the DLL circuit, obtaining an optimal divisor according to the overall loop delay, and in the phase-locking period of the DLL circuit, dividing the frequencies of the input clock signal and a feedback clock signal corresponding to the input clock signal according to the optimal divisor.

10 Claims, 5 Drawing Sheets

US 8,384,454 B2

DLL CIRCUIT WITH DYNAMIC PHASE-CHASING FUNCTION AND METHOD THEREOF

BACKGROUND OF THE INVENTION

1. Field of the Invention

The present invention is related to a delay locked loop (DLL) circuit, and more particularly, to a DLL circuit with dynamic phase-chasing function.

2. Description of the Prior Art

In the prior art, for improving steadiness of a delay locked loop (DLL) circuit, a frequency divider is used for avoiding unsteadiness due to the overhigh frequency of the input clock signal of the DLL circuit. However, the phase-chasing speed of the DLL circuit is consequently reduced because the frequency of the clock signal is divided by the frequency divider. In this way, the DLL circuit requires more time to chase phase, reducing efficiency of the DLL circuit. In other words, when the divisor used by the frequency divider is less, the DLL circuit is less stable. When the divisor of the frequency divider is greater, the efficiency of the DLL circuit is reduced. Therefore, in the prior art, the frequency divider which utilizes a fixed divisor either reduces the efficiency or steadiness of the DLL circuit.

SUMMARY OF THE INVENTION

The present invention provides a delay locked loop (DLL) circuit with dynamic phase-chasing function. The DLL circuit comprises a voltage control delay line (VCDL) circuit, a predetermined delay circuit, a divisor-adjustable frequency-dividing circuit, a phase/frequency detector, and a charge pump. The VCDL is utilized circuit for receiving an input clock signal and a control voltage, and delaying the input clock signal according to the control voltage to generate an output clock signal. The predetermined delay circuit is utilized for delaying the output clock signal for a predetermined period to generate a feedback clock signal. The divisor-adjustable frequency-dividing circuit is utilized for dividing frequencies of the input clock signal and the feedback clock signal, respectively, to generate a divided input clock signal and a divided feedback clock signal. The phase/frequency detector is utilized for comparing phases of the divided input clock signal and the divided feedback clock signal to generate an up signal and a down signal. The charge pump is utilized for adjusting the control voltage according to the up signal and the down signal. The divisor-adjustable frequency-dividing circuit detects an overall loop delay for the input clock signal in the DLL circuit to generate an optimal divisor, and divides the frequencies of the input clock signal and the feedback clock signal by the optimal divisor.

The present invention further provides a method of dynamically adjusting phase-chasing speed for increasing efficiency of a delay loop locked (DLL) circuit. The method comprises detecting an overall loop delay for an input clock signal in the DLL circuit, obtaining an optimal divisor according to the overall loop delay, and in a phase-locking period of the DLL circuit, dividing frequencies of the input clock signal and a feedback clock signal corresponding to the input clock signal according to the optimal divisor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
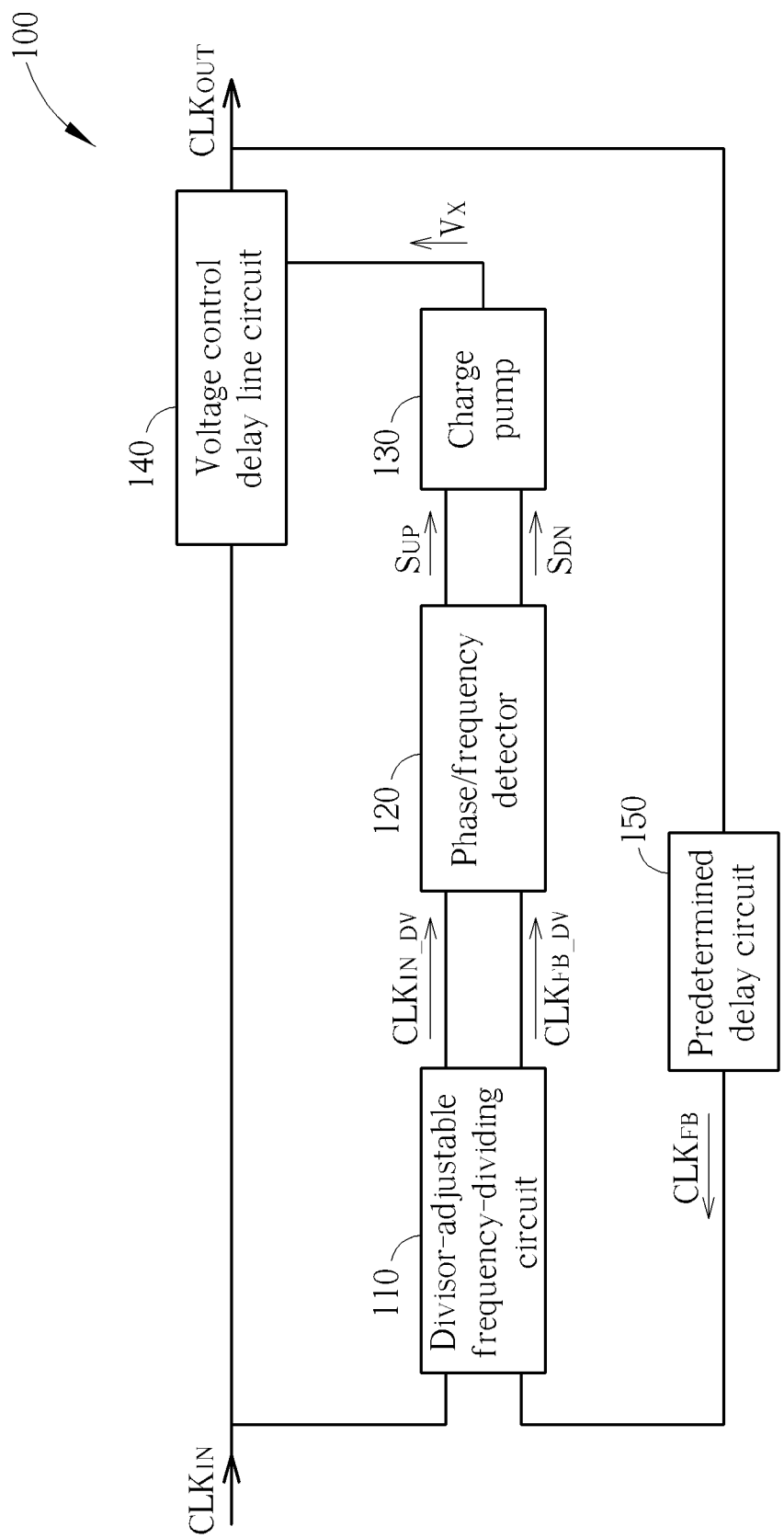
FIG. 1 is a diagram illustrating a delay locked loop (DLL) circuit with dynamic phase-chasing function according to an embodiment of the present invention.

Please refer to FIG. 1. FIG. 1 is a diagram illustrating a delay locked loop (DLL) circuit 100 with dynamic phase-chasing function according to an embodiment of the present invention. As shown in FIG. 1, the DLL circuit includes a divisor-adjustable frequency-dividing circuit 110, a phase/frequency detector (PFD) 120, a charge pump 130, a voltage control delay line (VCDL) circuit 140, and a predetermined delay circuit 150.

The divisor-adjustable frequency-dividing circuit 110 receives an input clock signal $CLK_{IN}$ and a feedback clock signal $CLK_{FB}$, and divides frequencies of the input clock signal $CLK_{IN}$ and the feedback clock signal $CLK_{FB}$ so as to generate the divided input clock signal $CLK_{IN\_DV}$ and the divided feedback clock signal $CLK_{FB\_DV}$, respectively.

The phase/frequency detector 120 receives the divided input clock signal $CLK_{IN\_DV}$ and the divided feedback clock signal $CLK_{FB\_DV}$, and compares the divided input clock signal $CLK_{IN\_DV}$ and the divided feedback clock signal $CLK_{FB\_DV}$ for outputting an up signal $S_{UP}$ or a down signal $S_{DN}$. When the phase of the divided input clock signal $CLK_{IN\_DV}$ leads that of the divided feedback clock signal $CLK_{FB\_DV}$, the phase/frequency detector 120 outputs the up signal $S_{UP}$. When the phase of the divided input clock signal $CLK_{IN\_DV}$ is left behind that of the divided feedback clock signal $CLK_{FB\_DV}$, the phase/frequency detector 120 outputs the down signal $S_{DN}$.

The charge pump 130 outputs a control voltage $V_X$. When the charge pump 130 receives the up signal $S_{UP}$, the charge pump 130 increases the voltage level of the control voltage $V_X$. When the charge pump 130 receives the down signal $S_{DN}$, the charge pump 130 decreases the voltage level of the control voltage $V_X$.

The VCDL circuit 140 receives the input clock signal $CLK_{IN}$, and delays the input clock signal $CLK_{IN}$ according to the control voltage $V_X$ to generate an output clock signal $CLK_{OUT}$. When the voltage level of the control voltage $V_X$ increases, delay provided by the VCDL circuit 140 for the input clock signal $CLK_{IN}$ decreases. When the voltage level of the control voltage $V_X$ decreases, the delay provided by the VCDL circuit 140 for the input clock signal $CLK_{IN}$ increases.

The predetermined delay circuit 150 receives the output clock signal $CLK_{OUT}$, and delays the output clock signal $CLK_{OUT}$ for a predetermined delay period so as to generate the feedback clock signal $CLK_{FB}$. The phase of the feedback clock signal $CLK_{FB}$ can be determined by setting the period length of the predetermined delay period.

Figure 2:
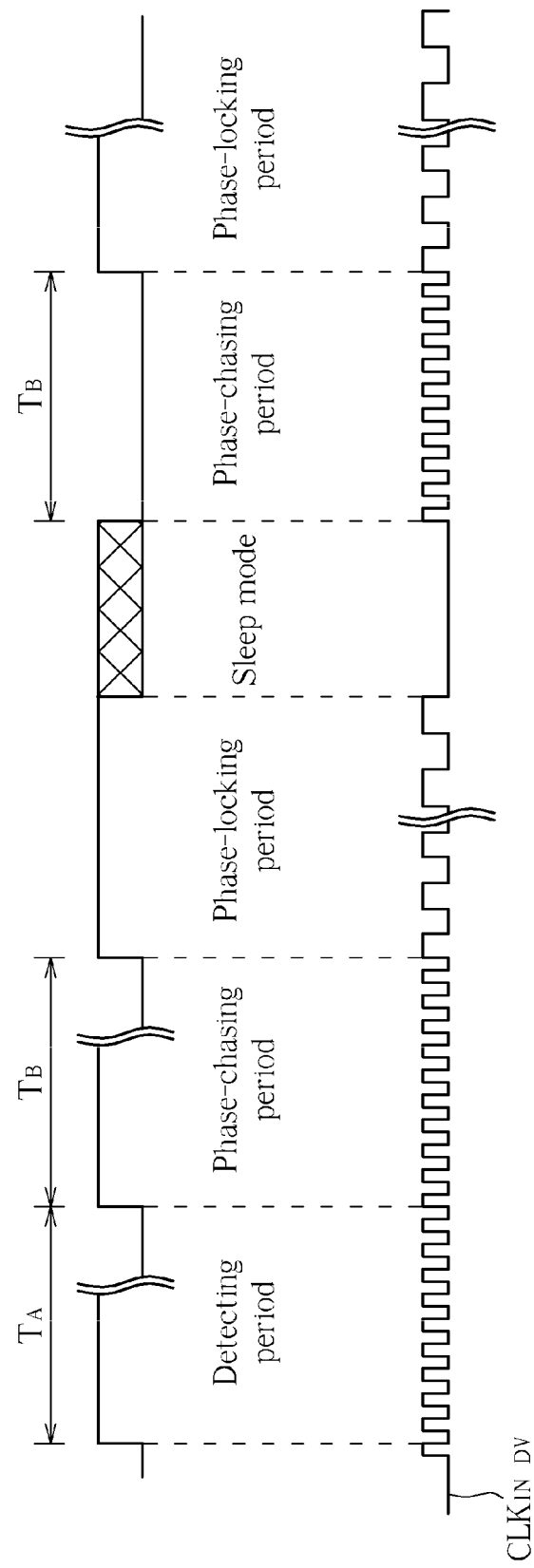
FIG. 2 is a diagram illustrating operation of the DLL circuit of FIG. 1.

Please refer to FIG. 2. FIG. 2 is a diagram illustrating the operation of the DLL circuit 100. As shown in FIG. 2, when the DLL circuit 100 is turned on, the DLL circuit 100 goes through a detecting period, a phase-chasing period, and a phase-locking period in sequence. In addition, after the DLL circuit 100 is turned on, if the DLL circuit 100 enters a sleep mode and then restores from the sleep mode, the DLL circuit 100 goes through the phase-chasing period and the phase-locking period in sequence again. It is noticeable that the detecting period has a fixed period length $T_A$, and the phase-chasing period has a fixed period length $T_B$. Each of the above-mentioned periods can maintain the corresponding period fixed length by a timer. In the detecting periods, a frequency-dividing divisor used by the divisor-adjustable frequency-dividing circuit 110 to divide frequencies is set to be 1. That is, the divisor-adjustable frequency-dividing circuit 110 does not divide the frequencies of the input clock signal $CLK_{IN}$ and the feedback clock signal $CLK_{FB}$. The divisor-adjustable frequency-dividing circuit 110 detects the overall loop delay of the DLL circuit 100 to obtain an optimal divisor for the DLL circuit 100 having optimal steadiness and unreduced efficiency in the phase-locking period. More particularly, in the detecting period, the DLL circuit 100 releases a pulse signal in the input clock signal $CLK_{IN}$, and determines the overall loop delay for the released pulse signal in the DLL circuit 100 according to the timing of the released pulse signal and the timing of a pulse signal in the feedback clock signal $CLK_{FB}$ corresponding to the released pulse signal. The optimal divisor can be further obtained according to the overall loop delay. In other words, the divisor-adjustable frequency-dividing circuit 110 can obtain the optimal divisor according to the released pulse signal in the input clock signal $CLK_{IN}$ and the corresponding pulse signal in the feedback clock signal $CLK_{FB}$. In the phase-chasing period, the frequency-dividing divisor used by the by the divisor-adjustable frequency-dividing circuit 110 is still equal to 1. In other words, the divisor-adjustable frequency-dividing circuit 110 does not divide the frequencies of the input clock signal $CLK_{IN}$ and the feedback clock signal $CLK_{FB}$ in the phase-chasing period. In this way, the phase-chasing speed of the DLL circuit 100 is accelerated so that the period of the DLL circuit 100 chasing the phase can be reduced. In the phase-locking period, the divisor-adjustable frequency-dividing circuit 110 divides the frequencies of the input clock signal $CLK_{IN}$ and the feedback clock signal $CLK_{FB}$ according to the optimal divisor. In addition, in the phase-locking period, the divisor-adjustable frequency-dividing circuit 110 can immediately set the frequency-dividing divisor to be the optimal divisor to divide the frequencies of the input clock signal $CLK_{IN}$ and the feedback clock signal $CLK_{FB}$, or increasingly adjusts the frequency-dividing divisor from 1 to the optimal divisor for the steadiness of the DLL circuit 100.

Figure 3:
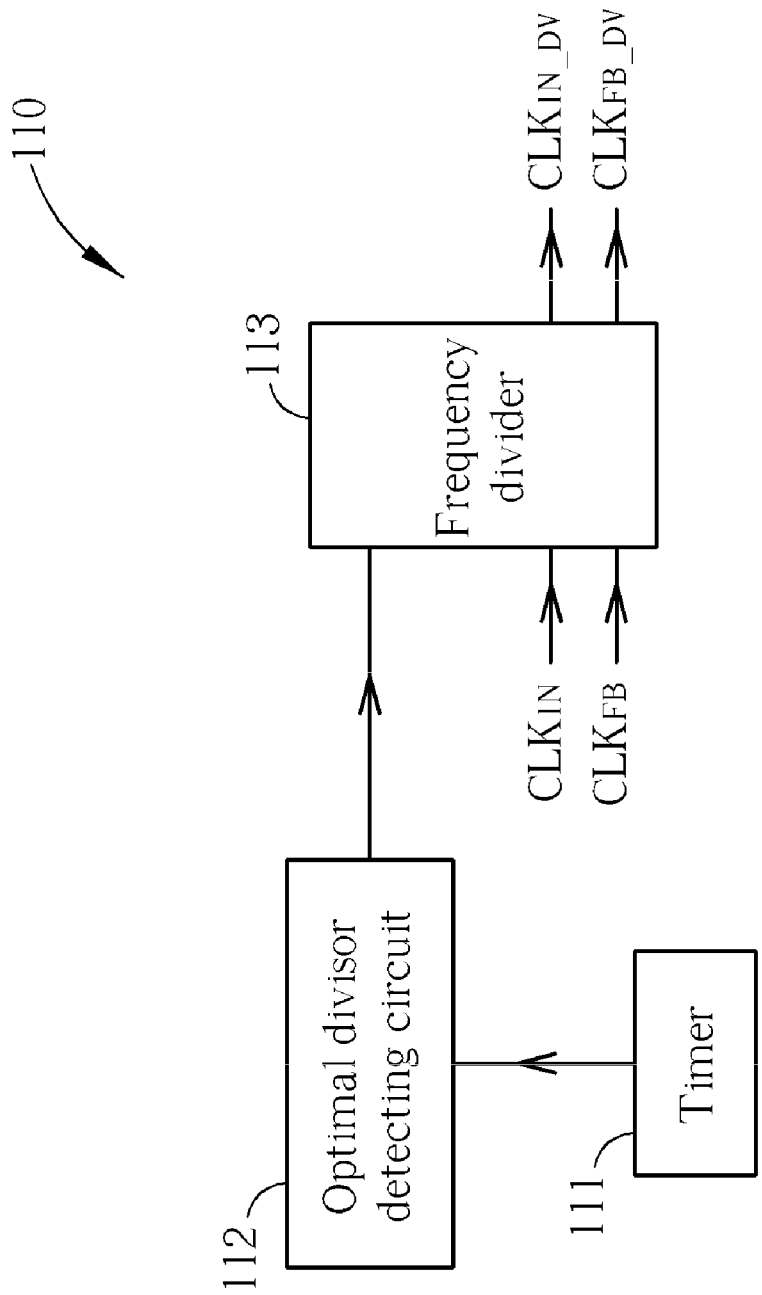
FIG. 3 is a diagram illustrating a divisor-adjustable frequency-dividing circuit according to an embodiment of the present invention.

Please refer to FIG. 3. FIG. 3 is a diagram illustrating the divisor-adjustable frequency-dividing circuit 110 according to an embodiment of the present invention. As shown in FIG. 3, the divisor-adjustable frequency-dividing circuit 110 includes a timer 111, an optimal divisor detecting circuit 112, and frequency divider 113.

The timer 111 is utilized for counting time to determine if the DLL circuit 100 is in the detecting period, the phase-chasing period, or the phase-locking period, and notifying the optimal divisor detecting circuit 112 which period the DLL circuit 100 is in.

The optimal divisor detecting circuit 112 detects the overall loop delay for the released pulse signal of the input clock signal $CLK_{IN}$ for obtaining the optimal divisor, and outputs a frequency control signal for indicating the magnitude of the frequency-dividing divisor used by the frequency divider to divide frequency. In the phase-chasing period, the frequency-dividing divisor indicated by the optimal divisor detecting circuit 112 is less (for example, the frequency-dividing divisor is equal to 1). In the phase-locking period, the frequency-dividing divisor indicated by the optimal divisor detecting circuit 112 is gradually adjusted to be the optimal divisor.

The frequency divider 113 receives frequency control signal for indicating the magnitude of the frequency-dividing divisor, and accordingly divides the frequencies of the input clock signal $CLK_{IN}$ and the feedback clock signal $CLK_{FB}$ by the frequency-dividing divisor for generating the divided input clock signal $CLK_{IN\_DV}$ and the divided feedback clock signal $CLK_{FB\_DV}$.

Figure 4:
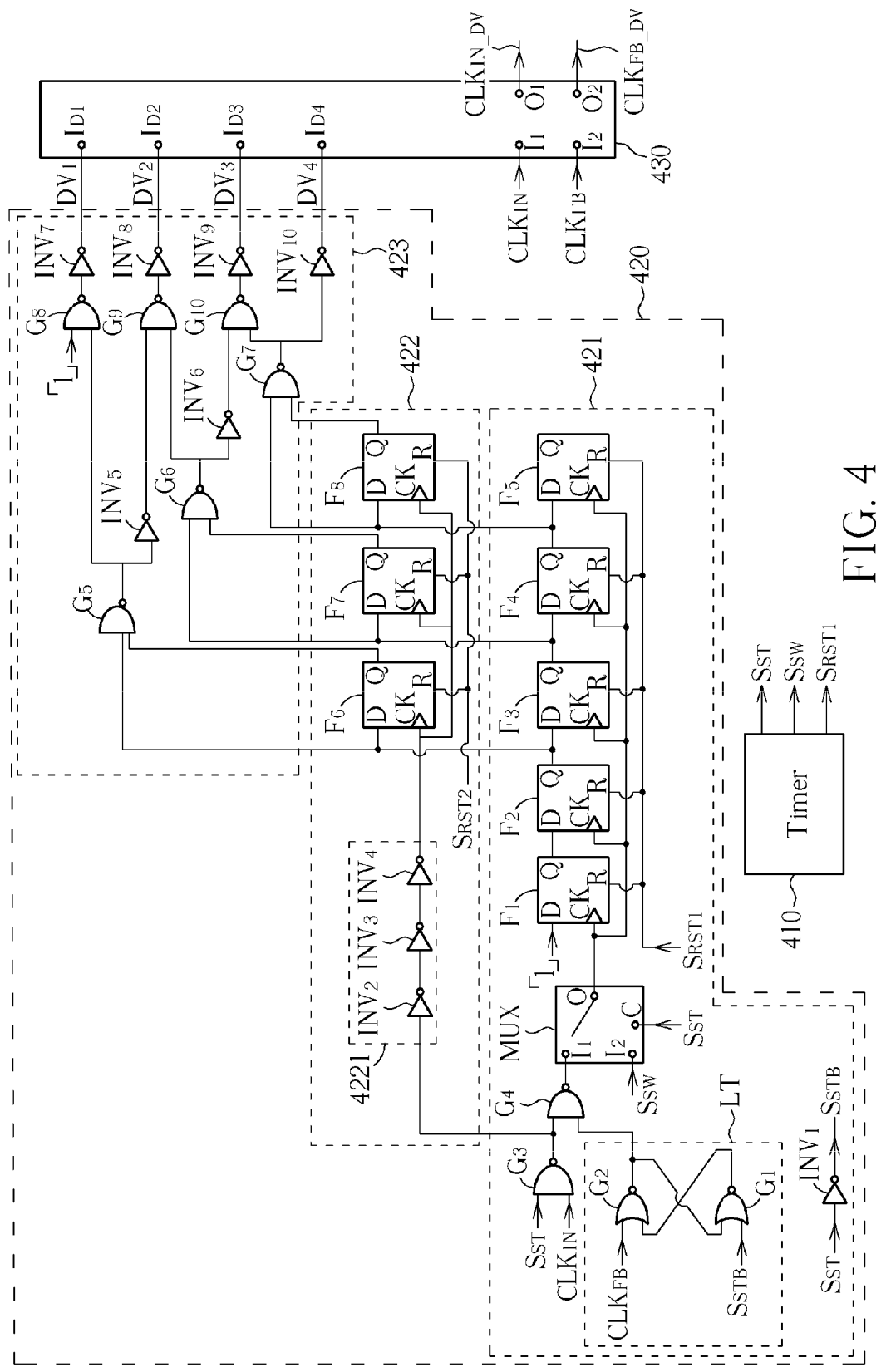
FIG. 4 is a diagram illustrating a divisor-adjustable frequency-dividing circuit according to another embodiment of the present invention.

Please refer to FIG. 4. FIG. 4 is a diagram illustrating a divisor-adjustable frequency-dividing circuit 400 according to another embodiment of the present invention. In FIG. 4, the upper limit of the frequency-dividing divisor outputted by the divisor-adjustable frequency-dividing circuit 400 is set to be "4". The divisor-adjustable frequency-dividing circuit 400 includes a timer 410, an optimal divisor detecting circuit 420, and a frequency-divider 430.

When the DLL circuit 100 is turned on, the timer 410 starts to count time for outputting a start signal $S_{ST}$, a switch signal $S_{SW}$, and a divisor-resetting signal $S_{RST1}$. More particularly, in the detecting period of the DLL circuit 100, the start signal $S_{ST}$ represents "starting" (for example, the start signal $S_{ST}$ represents the logic "1"); in the other periods, the start signal $S_{ST}$ represents "turning-off" (for example, the start signal $S_{ST}$ represents the logic "0"). The switch signal $S_{SW}$ is repeatedly switched between the logic "1" and the logic "0" when the DLL circuit 100 is in the phase-locking period. In this way, the transition (such as the rising edge) of the switch signal $S_{SW}$ can gradually adjust the frequency-dividing divisor used by the frequency divider 430.

The optimal divisor detecting circuit 420 includes an optimal divisor detector 421, an optimal divisor register 422, and a logic-calculating circuit 423. The optimal divisor detecting circuit 421 includes an inverter $INV_1$, a latch LT, logic gates $G_3$ and $G_4$, a multiplexer MUX, and flip-flops $F_1 \sim F_5$. The latch LT includes logic gates $G_1$ and $G_2$. The optimal divisor register 422 includes delay circuit 4221 and flip-flops $F_6 \sim F_8$. The delay circuit 4221 includes $INV_2 \sim INV_4$. The logic-calculating circuit 423 includes logic gates $G_5 \sim G_{10}$, and inverters $INV_5 \sim INV_{10}$. The logic gates $G_1$ and $G_2$ are NOR gates. The logic gates $G_3 \sim G_{10}$ are NAND gates. The flip-flops $F_1 \sim F_8$ are D-type flip-flops and are triggered by rising edges. Each of the flip-flops $F_1 \sim F_8$ includes a data input end D, a data output end Q, a clock input end CK, and a resetting end R. The delay circuit 4221 is utilized for synchronizing the clock signal received by the clock input end CK of the flip-flops $F_6 \sim F_8$ with the clock signal received by the clock input ends CK of the flip-flops $F_1 \sim F_5$, and the number of inverters in the delay circuit 4221 is accordingly designed for the requirement.

The inverter $INV_1$ receives the start signal $S_{ST}$ and accordingly generates an inverted start signal $S_{STB}$. The two input ends of the latch LT receives the feedback clock signal $CLK_{FB}$ and the inverted start signal $S_{STB}$, respectively. The output end of the latch LT is coupled to an input end of the logic gate $G_4$. The multiplexer MUX includes input ends $I_1$ and $I_2$, an output end O, and a control end C. The input end $I_1$ of the multiplexer MUX is coupled to the output end of the logic gate $G_4$. The input end $I_2$ of the multiplexer MUX receives the switch signal $S_{SW}$. The output end O of the multiplexer MUX is coupled to the clock input ends CK of the flip-flops $F_1 \sim F_5$. The control end C of the multiplexer MUX receives the start signal $S_{ST}$. When the start signal represents "starting" (the logic "1"), the input end $I_1$ of the multiplexer MUX is coupled to the output end O of the multiplexer MUX. When the start signal represents "turning-off" (the logic "0"), the input end $I_2$ of the multiplexer MUX is coupled to the output end O of the multiplexer MUX. Frequency divider 430 includes divisor input ends $I_{D1}$~$I_{D4}$, input ends $I_1$ and $I_2$, and output ends $O_1$ and $O_2$. The divisor input ends $I_{D1}$~$I_{D4}$ of the frequency divider 430 are coupled to the output ends of the inverters $INV_7$~$INV_{10}$ in the logic-calculating circuit 423, respectively. The input end $I_1$ of the frequency divider 430 receives the input clock signal $CLK_{IN}$. The input end $I_2$ of the frequency divider 430 receives the feedback clock signal $CLK_{FB}$. The output end $O_1$ of the frequency divider 430 outputs the divided input clock signal $CLK_{IN\_DV}$. The output end $O_2$ of the frequency divider 430 outputs the divided feedback clock signal $CLK_{FB\_DV}$. The frequency divider 430 determines the frequency-dividing divisor according to the logic of the signals (divisor control signal) received by the divisor input end $I_{D1}$~$I_{D4}$. More particularly, when the logic of the signal received by the divisor input end $I_{D1}$ is "1", the frequency-dividing divisor used by the frequency divider 430 is equal to 1. When the logic of the signal received by the divisor input end $I_{D2}$ is "1", the frequency-dividing divisor used by the frequency divider 430 is equal to 2. When the logic of the signal received by the divisor input end $I_{D3}$ is "1", the divisor used by the frequency divider 430 is equal to 3. When the logic of the signal received by the divisor input end $I_{D4}$ is "1", the divisor used by the frequency divider 430 is equal to 4. For example, when the logic of the signal received by the divisor input end $I_{D3}$ is "1", the frequency divider 430 divides the frequencies of the input clock signal $CLK_{IN}$ and the feedback clock signal $CLK_{FB}$ by 3 to generate the divided input clock signal $CLK_{IN\_DV}$ and the divided feedback clock signal $CLK_{FB\_DV}$. In this case, the frequency of the input clock signal $CLK_{IN}$ is three times that of the divided input clock signal $CLK_{IN\_DV}$, and the frequency of the feedback clock signal $CLK_{FB}$ is three times that of the divided feedback clock signal $CLK_{FB\_DV}$. In addition, it is noticeable that the data input end D of the flip-flop $F_1$ receives a signal with fixed logic "1", and an input end of the logic gate $G_8$ receives a signal with fixed logic "1".

When the start signal $S_{ST}$ represents "starting" (the logic "1"), that is, when the inverted start signal $S_{STB}$ represents the logic "0", it represents the DLL circuit 100 is in the detecting period. At the time, the input end $I_1$ of the multiplexer MUX is coupled to the output end O of the multiplexer MUX. The input clock signal $CLK_{IN}$ is transmitted to the input end $I_1$ of the multiplexer MUX through the logic gates $G_3$ and $G_4$. As a result, the flip-flops $F_1$~$F_5$ are triggered by the rising edge of the input clock signal $CLK_{IN}$ so that the data received by the data input end D of the flip-flop $F_1$ can be transmitted in sequence to the flip-flops $F_6$~$F_8$ in the optimal divisor register 422. When the feedback clock signal $CLK_{FB}$ generates a rising edge corresponding to the pulse signal in the input clock signal $CLK_{IN}$ released by the DLL circuit 100, the latch LT outputs the logic "1" to the logic gate $G_4$ for stopping the input clock signal $CLK_{IN}$ being transmitted to the flip-flops $F_1$~$F_5$ through the logic gate $G_4$. That is, when the pulse signal in the input clock signal $CLK_{IN}$ released by the DLL circuit 100 passes through whole DLL circuit 100 and comes back to the divisor-adjustable frequency-dividing circuit 400, the flip-flops $F_1$~$F_5$ stops transmitting data (the logic "1"). Thus, the logic-calculating circuit 423 processes logic calculation according to the status of the flip-flops $F_6$~$F_8$ in the optimal divisor register 422 so that the inverters $INV_7$~$INV_{10}$ can output the divisor control signals $DV_1$~$DV_4$ to the divisor input end $I_{D1}$~$I_{D4}$ of the frequency divider 430. The frequency divider 430 selects the frequency-dividing divisor according to the divisor control signals $DV_1$~$DV_4$, and the frequency-dividing divisor selected according to the divisor control signals $DV_1$~$DV_4$ is the optimal divisor.

When the start signal $S_{ST}$ is switched from representing "turning-on" (the logic "1") to "turning-off" (the logic "0"), it represents the detecting period is over, and the phase-chasing period starts. The input end $I_2$ of the multiplexer MUX is coupled to the output end O of the multiplexer MUX. That is, the clock input ends of the flip-flops $F_1$~$F_5$ receive the switch signal $S_{SW}$. Meanwhile, the timer 410 sends the divisor-resetting signal $S_{RST1}$ representing the logic "1" to the resetting end R of the flip-flops $F_1$~$F_5$ of the optimal divisor detector 421 to clear all data for setting the frequency-dividing divisor used by the frequency divider 430 is equal to 1 (in other words, the divisor control signal $DV_1$ represents the logic "1"). In phase-chasing period, the switch signal $S_{SW}$ is not switched for the frequency-dividing divisor of the frequency divider 430 remaining equal to 1. When the phase-chasing period is over and the phase-locking period starts, the switch signal $S_{SW}$ starts to be switched between the logic "1" and "0" for generating rising edges to trigger the flip-flops $F_1$~$F_5$ to transmit data. In this way, the frequency-dividing divisor can be gradually increased. More particularly, when the DLL circuit 100 enters the phase-locking period, the logic of the divisor control signal $DV_1$ is "1" so that the frequency-dividing divisor is equal to 1. After the first rising edge of the switch signal $S_{SW}$, the logic of the divisor control signal $DV_2$ is changed to be "1" so that the frequency-dividing divisor used by the frequency divider 430 is adjusted to be 2. Therefore, according to the above-mentioned illustration, the frequency-dividing divisor used by the frequency divider 430 can be gradually adjusted to be the optimal divisor by means of the rising edges of the switch signal $S_{SW}$.

In addition, the data of the flip-flops $F_6$~$F_8$ can be cleared by means of inputting the divisor-resetting signal $S_{RST1}$ representing "resetting" (for example, the logic "1"). In this way, the optimal divisor detecting circuit 420 can re-detect the optimal divisor.

Figure 5:
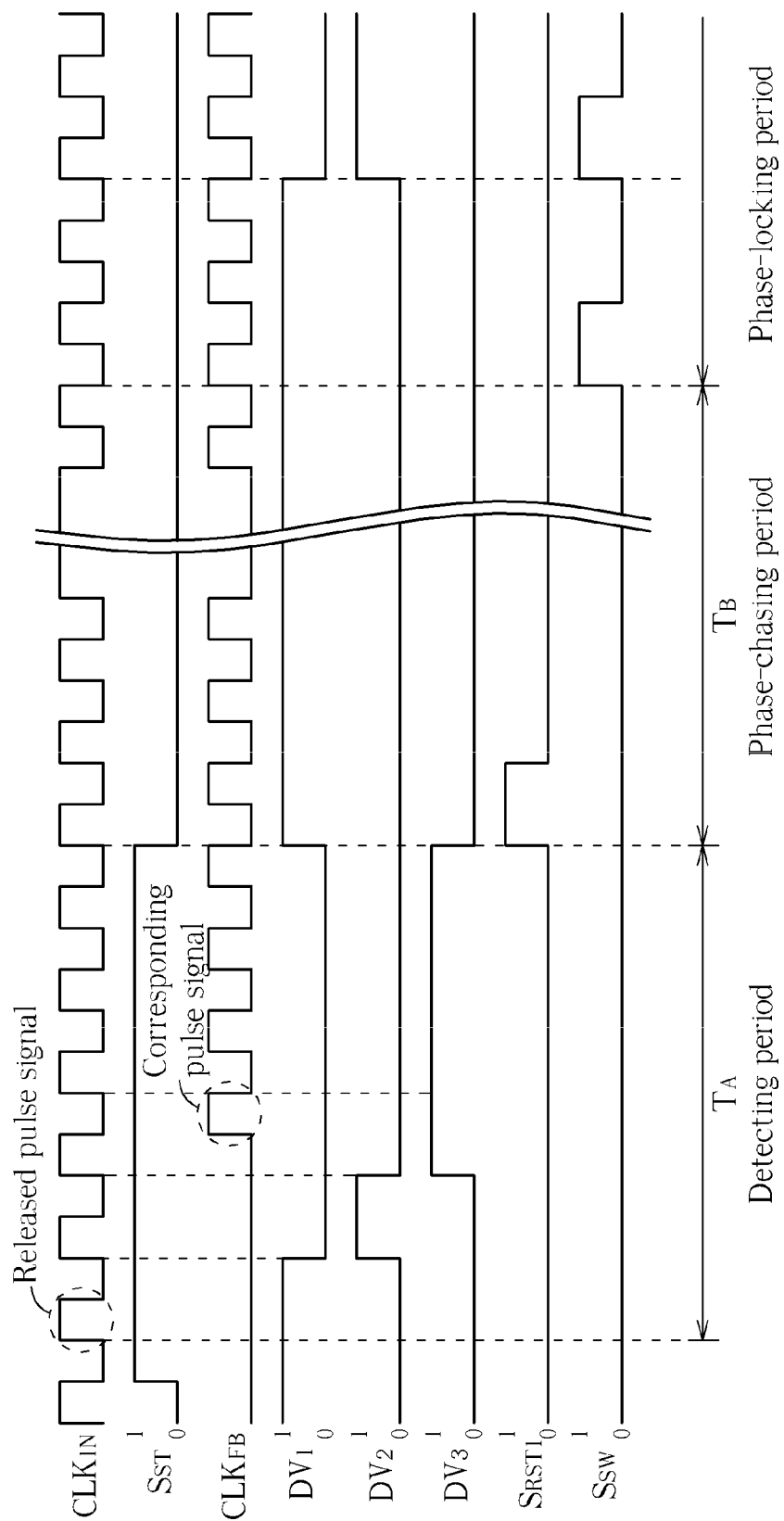
FIG. 5 is a time sequence diagram illustrating the internal signals of the divisor-adjustable frequency-dividing circuit of FIG. 4.

Please refer to FIG. 5. FIG. 5 is a time sequence diagram illustrating the internal signals of the divisor-adjustable frequency-dividing circuit 400. As shown in FIG. 5, in the detecting period, the feedback clock signal $CLK_{FB}$ generates a pulse signal corresponding to the released pulse signal in the input clock signal $CLK_{IN}$. Since the corresponding signal in the feedback clock signal $CLK_{FB}$ is generated before the $3^{rd}$ rising edge in the input clock signal $CLK_{IN}$ which comes after the released pulse signal, the optimal divisor can be accordingly determined to be 3. In the phase-chasing period, the divisor-resetting signal $S_{RST1}$ represents "resetting" (the logic "1") for setting the frequency-dividing divisor used by the frequency divider 430 to be 1. In other words, the frequency divider does not divide frequencies. In this way, the phase-chasing speed of the DLL circuit 100 increases. In the phase-locking period, the switch signal $S_{SW}$ starts to be switched between the logic "1" and "0" for generating rising edges. In this way, the frequency-dividing divisor used by the frequency divider 430 is increasingly adjusted to be from 1 to the optimal divisor (3). Hence, the steadiness of the DLL circuit 100 is improved.

In conclusion, the DLL circuit provided by the present invention has a dynamic phase-chasing function. In the detecting period, the overall loop delay of the DLL circuit is detected for obtaining the optimal divisor. In the phase-chasing period, the frequencies of the clock signals are divided by the minimum divisor for accelerating the phase-chasing speed. In the phase-locking period, the frequency-dividing divisor used by the frequency divider gradually adjusted for improving the steadiness of the DLL circuit. In this way, the DLL circuit can have a fast chasing-speed and good steadiness.

Those skilled in the art will readily observe that numerous modifications and alterations of the device and method may be made while retaining the teachings of the invention.

What is claimed is:

1. A delay locked loop (DLL) circuit with dynamic phase-chasing function, comprising:
    a voltage control delay line (VCDL) circuit for receiving an input clock signal and a control voltage, and delaying the input clock signal according to the control voltage to generate an output clock signal;
    a predetermined delay circuit for delaying the output clock signal for a predetermined period to generate a feedback clock signal;
    a divisor-adjustable frequency-dividing circuit for dividing frequencies of the input clock signal and the feedback clock signal, respectively, to generate a divided input clock signal and a divided feedback clock signal, the divisor-adjustable frequency-dividing circuit comprising a timer for counting time to determine if the DLL circuit is in a detecting period, phase-chasing period, or a phase-locking period, wherein the DLL circuit releases a pulse signal in the input clock signal in the detecting period;
    a phase/frequency detector for comparing phases of the divided input clock signal and the divided feedback clock signal to generate an up signal or a down signal; and
    a charge pump for adjusting the control voltage according to the up signal and the down signal;
    wherein the divisor-adjustable frequency-dividing circuit detects an overall loop delay of the input clock signal in the DLL circuit to generate an optimal divisor, and divides the frequencies of the input clock signal and the feedback clock signal according to the optimal divisor.

2. The DLL circuit of claim 1, wherein the divisor-adjustable frequency-dividing circuit further comprises:
    an optimal divisor detecting circuit for obtaining the optimal divisor according to a pulse signal in the feedback clock signal corresponding to the released pulse signal and the released pulse signal, and accordingly outputting a divisor control signal; and
    a frequency divider for dividing the frequencies of the input clock signal and the feedback clock signal according to the divisor control signal, respectively, to generate the divided input clock signal and the divided feedback clock signal.

3. The DLL circuit of claim 2, wherein in the phase-chasing period, the optimal divisor detecting circuit sets a frequency-dividing divisor used by the frequency divider to be one through the divisor control signal for the frequency divider not to divide the frequencies of the input clock signal and the feedback clock signal to accelerate phase-chasing speed of the DLL circuit.

4. The DLL circuit of claim 3, wherein in the phase-locking period, the optimal divisor detecting circuit increasingly adjusts the frequency-dividing divisor used by the frequency divider from one to the optimal divisor through the divisor control signal for maintaining steadiness of the DLL circuit in the phase-locking period.

5. The DLL circuit of claim 1, wherein when a phase of the divided input clock signal leads a phase of the divided feedback clock signal, the phase/frequency detector generates the up signal; and when the phase of the divided input clock signal is left behind the phase of the divided feedback clock signal, the phase/frequency detector generates the down signal.

6. The DLL circuit of claim 5, wherein when the phase/frequency detector generates the up signal, the charge pump increases voltage level of the control voltage; and when the phase/frequency detector generates the down signal, the charge pump decreases the voltage level of the control voltage.

7. The DLL circuit of claim 6, wherein when the voltage level of the control voltage increases, delay provided by the VCDL circuit for the input clock signal decreases; and when the voltage level of the control voltage decreases, the delay provided by the VCDL circuit for the input clock signal increases.

8. A method of dynamically adjusting phase-chasing speed for increasing efficiency of a delay loop locked (DLL) circuit, comprising:
    detecting an overall loop delay for an input clock signal in the DLL circuit;
    obtaining an optimal divisor according to the overall loop delay;
    counting time with a timer to determine if the DLL circuit is in a detecting period, phase-chasing period, or a phase-locking period, wherein the DLL circuit releases a pulse signal in the input clock signal in the detecting period; and
    in the phase-locking period of the DLL circuit, dividing frequencies of the input clock signal and a feedback clock signal corresponding to the input clock signal according to the optimal divisor.

9. The method of claim 8, further comprising:
not dividing the frequencies of the input clock signal and the feedback clock signal in the phase-chasing period of the DLL circuit to increase phase-chasing speed of the DLL circuit.

10. The method of claim 9, wherein in the phase-locking period of the DLL circuit, dividing the frequencies of the input clock signal and the feedback clock signal corresponding to the input clock signal according to the optimal divisor comprising:
    dividing the frequencies of the input clock signal and the feedback clock signal by a frequency-dividing divisor; and
    increasingly adjusting the frequency-dividing divisor from one to the optimal divisor.

* * * * *